United States Patent [19]
Benson et al.

[11] Patent Number: 5,383,096
[45] Date of Patent: Jan. 17, 1995

[54] I/O EXPANSION BOX

[75] Inventors: Matthew C. Benson, Fitchburg; Laurence M. Mazzone, Tewksbury, both of Mass.

[73] Assignee: Digital Equipment Corporation, Maynard, Mass.

[21] Appl. No.: 56,552

[22] Filed: May 3, 1993

[51] Int. Cl.$^6$ ............................................. H05K 9/00
[52] U.S. Cl. .................................... 361/816; 361/752; 361/796; 361/800; 361/809; 174/17 R; 174/35 R
[58] Field of Search ................ 361/816, 730, 732, 752, 361/759, 796, 800, 809, 827; 174/17 R, 260, 35 R, 35 TS; 439/44, 377

[56] References Cited

U.S. PATENT DOCUMENTS

| | | | |
|---|---|---|---|
| 4,652,969 | 3/1987 | Stegenga | 361/384 |
| 4,901,205 | 2/1990 | Landis et al. | 361/424 |
| 4,979,075 | 12/1990 | Murphy | 361/399 |

*Primary Examiner*—Leo P. Picard
*Assistant Examiner*—Young Whang
*Attorney, Agent, or Firm*—Krishnendu Gupta; Ronald C. Hudgens; Albert P. Cefalo

[57] ABSTRACT

An apparatus for increasing the number of electrical I/O ports on an existing computer system chassis, while maintaining the RF shield of the chassis and without changing the design of the existing chassis, by the use of an I/O expansion box. The I/O expansion box comprises a bottom and a cover. The bottom has a base plate with openings for cables from the computer chassis to pass therethrough and has lips at the openings. The lips extend outwardly away from the recess and are used to attach the base plate to the chassis at its I/O port openings. The cover has a top with openings therein for the attachment of electrical cable connectors that are attached to the cables from the computer chassis. The number of openings in the top of the cover are greater than the number of openings in the base plate of the bottom. A "U" or channel type mounting clip is used to attach the I/O expansion box to an I/O port opening in an exterior panel on the computer system chassis and to extend the RF shielding of the computer system chassis to the I/O expansion box.

11 Claims, 4 Drawing Sheets

I/O EXPANSION BOX

BACKGROUND OF THE INVENTION

Computer systems often have to be upgraded to provide added functionality. Providing added functionality requires providing added input/output (I/O) capabilities to access various functional units within the computer chassis. This is achieved by providing additional electrical I/O ports to a computer chassis for the attachment of electrical cable connectors for the transmission of electrical signals in and out of the computer chassis.

Traditionally, adding functionality to a computer system has been accomplished by redesigning the computer chassis to provide added I/O ports, while maintaining the RF shield of the chassis. Consequently, upgrading to increased functionality resulted in significant costs due to re-design time of the computer chassis, and high scrap costs due to obsolescence of the older chassis. Therefore, a need exists for a method and apparatus for increasing the number of electrical I/O ports to a computer chassis without redesigning the existing chassis, while maintaining the RF shield.

SUMMARY OF THE INVENTION

The present invention is an apparatus for increasing the number of electrical I/O ports on an existing computer chassis, while maintaining the RF shield of the chassis, without changing the design of the existing chassis.

An object of the invention is to provide additional functionality to an existing computer system by providing additional I/O slots to an existing computer chassis.

Another object of the invention is the reduction of engineering design time and scrap costs while adding functionality to an existing computer system.

These and other objects are attained, in a broad sense, through the use of an I/O expansion box according to the present invention. The I/O expansion box includes a bottom having a base plate with lateral side walls that extend normally away from the base plate, thereby forming a bottom recess. The base plate has openings for cables from the computer chassis to pass therethrough and has lips at the openings. The lips extend outwardly away from the recess and are used in attaching the base plate to the chassis at its I/O port openings. One of the side walls has slots thereon, another side wall has tabs thereon, and some of the side walls having tabs thereon further has clips thereon. The I/O expansion box also has a cover. The cover has a top with lateral extending side walls that form a top recess. The top also has openings therein for the attachment of electrical cable connectors that are attached to the cables from the computer chassis. The number of those openings are greater than the number of openings in the base plate of the bottom. Moreover, one of the side walls of the cover has pivot points at an edge thereon for mating with the bottom side wall slots. And another side wall of the cover has openings for mating with the bottom side wall clips to hold the bottom and the cover together to close the I/O expansion box.

In another sense the objects of the invention are attained through the use of a "U" or channel type mounting clip to attach the I/O expansion box to an I/O port opening in an exterior panel on the computer system chassis and to extend the RF shielding of the computer system chassis to the I/O expansion box.

In a more specific sense the objects of the invention are attained through the use of an I/O expansion box that includes a cover having a top in slanted relationship with respect to the exterior panel of the computer system chassis to accommodate for the bending radius of electrical cable.

It is an advantage of this invention that I/O capability of an existing computer chassis can be increased without redesigning the chassis.

It is another advantage of this invention that one common system chassis can be used for all systems and suitable I/O expansion boxes can be attached to the system chassis to provide the I/O functionality needed.

The foregoing and additional objects, features and advantages of the present invention will become apparent to those skilled in the art from a more detailed consideration of the preferred embodiment thereof, taken in conjunction with the accompanying drawings.

BRIEF DESCRIPTION OF THE DRAWINGS

FIG 1a is an enlarged perspective view of the I/O expansion box shown in FIG. 1.

FIG. 2 is a perspective view of the bottom of the I/O expansion box shown in FIGS. 1 and 1a.

FIG. 3 is a perspective view of the cover of the I/O expansion box shown in FIGS. 1 and 1a.

DETAILED DESCRIPTION OF THE INVENTION

Figure 1:
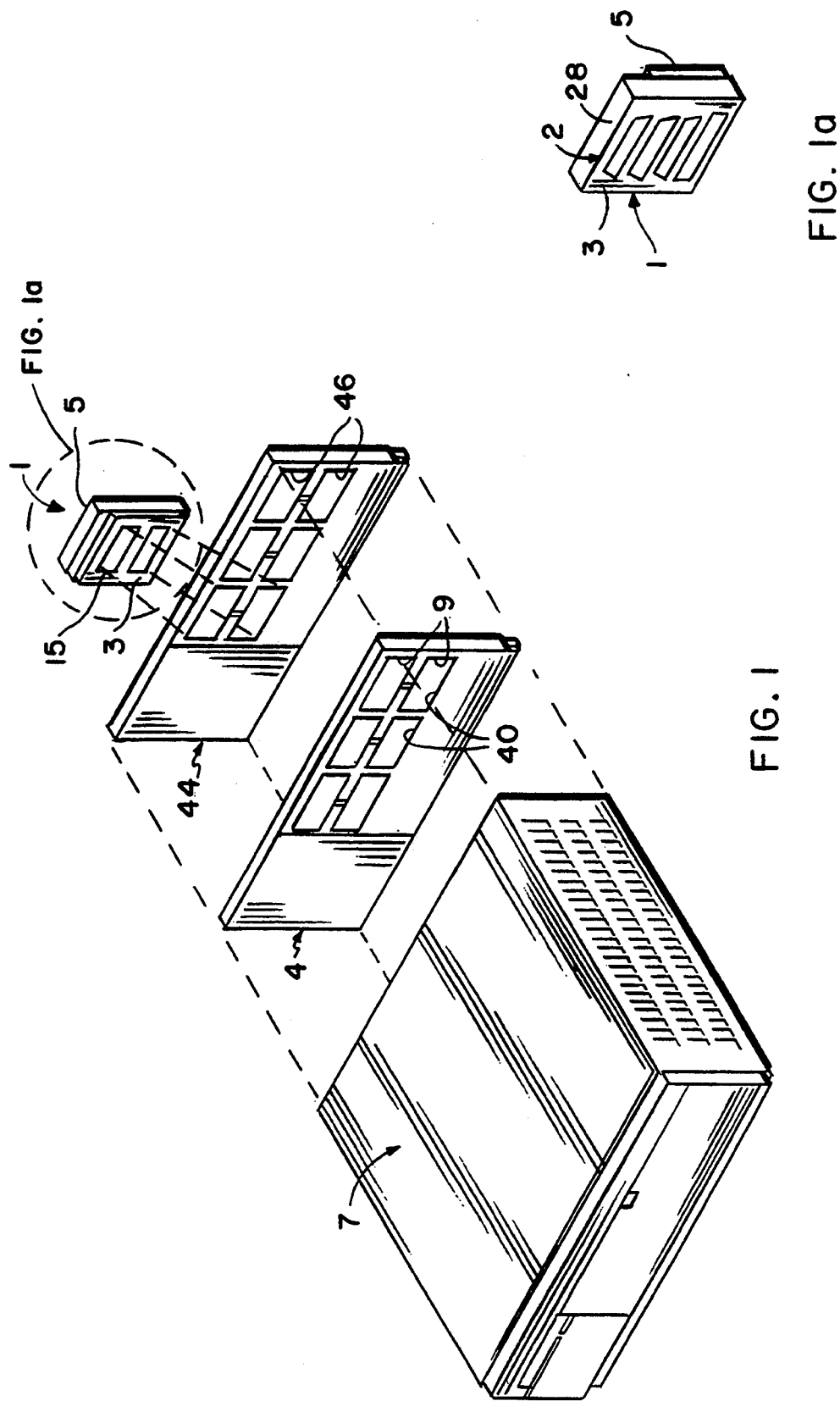
FIG. 1 is an exploded perspective view of a computer system chassis showing the rear panel having I/O ports and an associated I/O expansion box according to the principles of the invention.

There is illustrated in FIG. 1 a computer system chassis 7 and an associated I/O expansion box 1. FIG 1a is an enlarged view of the I/O expansion box 1 comprising a cover 3 and a bottom 5. The computer system chassis 7 has a rear panel 4 with six I/O ports 9. A plastic bezel 44 is attached to the chassis 7 to cover the rear panel 4 for aesthetic reasons. The bezel 44 has openings 46 aligned to the I/O ports 9 on the rear panel 4. As shown, the openings 46 are substantially the same size but slightly larger than the I/O ports 9. Added functionality to the computer system chassis 7 is provided by the I/O expansion box 1. As shown the I/O expansion box 1 allows an increase from six I/O ports to eight I/O ports and mates with two of the I/O ports 9 of the computer chassis 7. Further expansion is possible by using different embodiments of the expansion boxes according to the invention.

Figure 2:
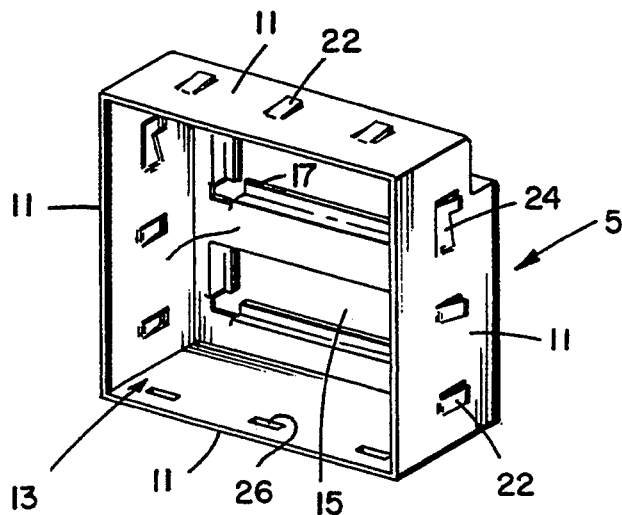

As a shown in FIG. 1 the I/O expansion box consists of a bottom 5 and a cover 3. As more clearly shown in FIG. 2, the bottom 5 has a base plate 6 and lateral side walls 11 that extend normally away from the base plate 6 to form a recess 13. As shown the base plate 6 has two openings 15; each of the openings 15 has lips 17 to attach the bottom 5 to the rear panel 4 at I/O ports 9. The lips 17, as shown in FIG. 2, extend outwardly of the base plate 6 away from the recess 13 and are shaped for clipped attachment. For computer systems using a plastic bezel 44 to cover the rear panel 4, good results have been obtained by using lips 17 that are "L"-shaped, designed to extend through opening 46 in the plastic bezel 44 and mate with the I/O ports 9 in the rear panel 4 of the chassis 7. The edges of openings 46 in the plastic bezel 44 act as restraints for the lips 17 and prevent them from moving around in the vertical and horizontal directions.

Figure 7:
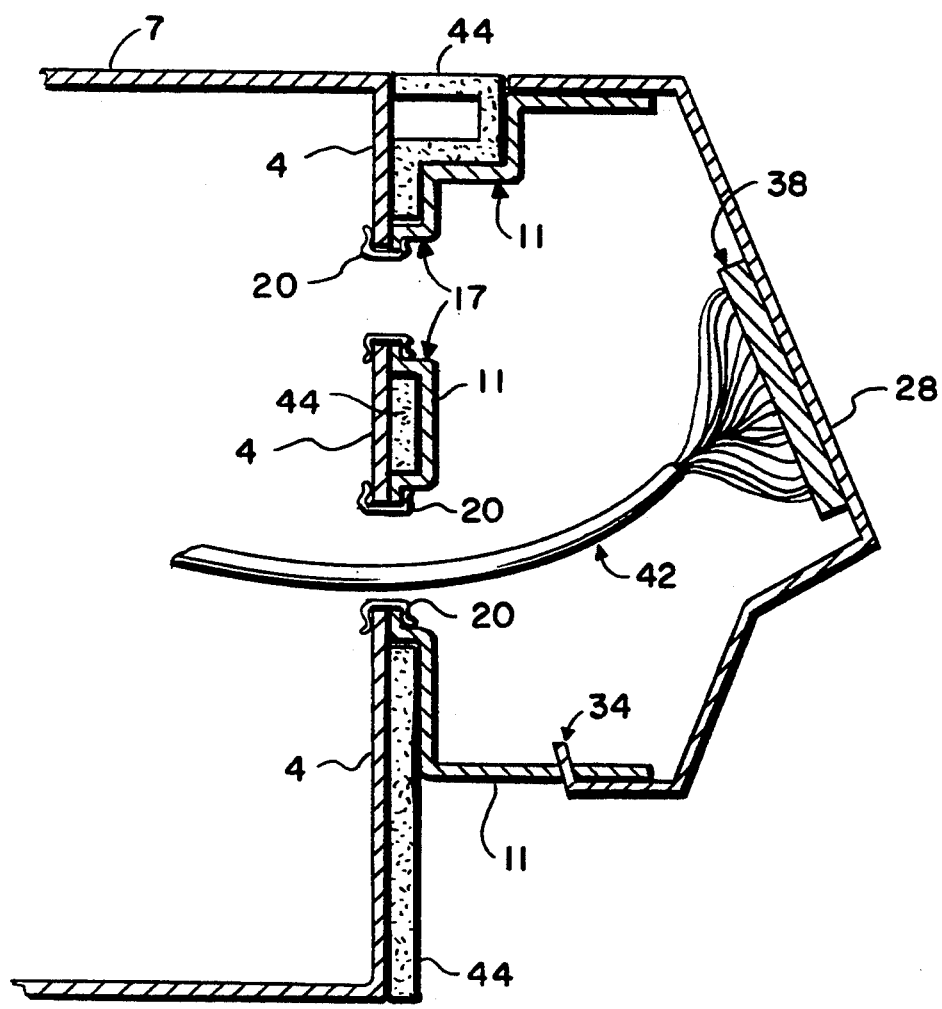
FIG. 7 is a cross-section view of an I/O expansion box bottom attached to the rear panel of a computer system chassis using the "U" clip of FIG. 6.

The bottom 5 is attached to the rear panel 4 of the chassis 7 at two adjacent I/O ports 9 by using a mounting arrangement using "U" clips 20. As shown in FIG. 7, the lips 17 at each opening 15 of the base plate 6 are aligned with the edges 40 of I/O ports 9 and are held in place by snapping on clip 20. The clip 20 is made of stainless steel and coated with epoxy material. Additionally, the clips 20 act as edge protectors and cover the burrs on the lips 17 and the edges 40 of the I/O ports 9 thereby protecting the I/O cables that run through from chaffing against the burrs on the edges 40 and the lips 17. For a more detailed description of the clip 20 see U.S. Pat. No. 4,769,966, which is specifically incorporated herein by reference.

As shown in FIG. 2, three adjacent side walls 11 of the bottom 5 have tabs 22 that extend in an outward direction from the side walls 11. Additionally, two opposite side walls of the three adjacent side walls 11 have clips 24 that extend in an outward direction. As shown, the clips 24 are formed by a stamping operation, but can be formed using other methods. A fourth side wall 11 has slots 26 mechanically stamped out. Good results have been obtained by making the bottom 5 out of mild steel, while metallized plastic could also be used instead.

As shown in FIG. 2 the base plate 6 of the bottom 5 is 3.8 inches long and 3.8 inches wide, the side walls 11 are 1.1 inches deep and each opening 15 on the base plate 6 is 2 inches by 1 inch in dimension. These measurements produced good results when used to design an I/O expansion box for the computer system chassis 7 shown in FIG. 1.

Figure 3:
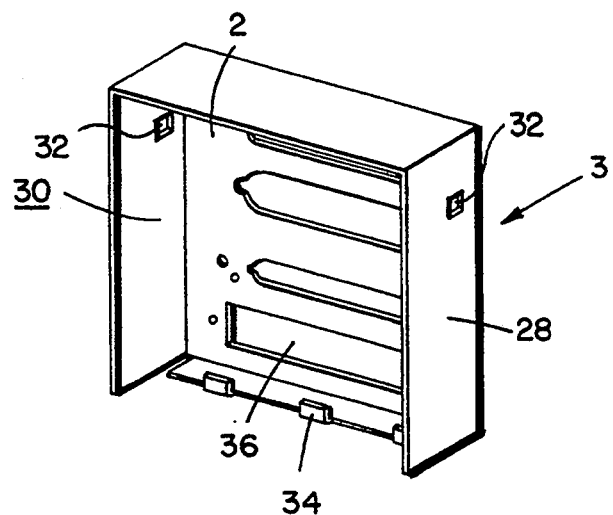

FIG. 3 more clearly shows the details of cover 3. As shown cover 3 has a top 2 and lateral side walls 28 that extend normally away from the top 2 to form a recess 30. Opposite side walls 28 have openings 32. A third side wall 28 has pivots 34 formed along its edge. As shown in FIG. 3, the top 3 has four openings 36 thereon that act as I/O ports for the attachment of electrical connectors 38 for I/O cables. Good results have been obtained by making the cover 3 out of mild steel, while other materials such as metallized plastic may also be used instead.

When added functionality is required from a computer system, an I/O expansion box 1 is attached to the rear panel 4 of the computer chassis 7, to provide I/O ports for additional I/O cables. In order to attach an I/O expansion box 1 the I/O cables are first exited out of the chassis 7 through I/O ports 9 and are then inserted through the openings 15 of the base plate 6 such that the recess 13 of the bottom 5 faces away from the rear panel 4. The bottom 5 is then attached to the rear panel 4 by first aligning the lips 17 at the openings 15 of the base plate 6 to the edges 40 of the I/O ports 9 on the rear panel 4 of the chassis 7 and are then clamped together using clips 20 along edges of the lips 17 and the edges 40 of the I/O ports 9.

The connectors 38 at the end of the I/O cables are next attached to the openings 36 of the top plate 2 of the cover 3. The cover 3 is then aligned with the bottom plate 5 such that the pivots 34 of the cover 3 are engaged with the slots 26 of the bottom plate 5. Using the pivots 34 as hinges the cover 3 is press fitted to the bottom plate 5 such that the side walls 28 of the cover 3 fit over the side walls 11 of the bottom 5. The clips 24 of side wall 11 of the bottom 5 snap into the openings 32 stamped out in the side walls 28 of the cover 3, thereby holding the cover 3 and the bottom 5 together to form the expansion box 1. The recess 13 formed by the side walls 11 of the bottom 5 and the recess 30 formed by the side walls 28 of the cover 3 together form a housing for the body of the electrical connectors 38 and I/O cables 42 that are attached to openings 36 of the cover 3 of the I/O expansion box 1. The tabs 22 that extend out from the side walls 11 of the bottom 5 make contact with the side walls 28 of the cover 3 thereby providing physical continuity between the bottom 5 and the cover 3.

It is important to maintain the RF shielding of I/O cables 42 within the I/O expansion box 1. This is accomplished by extending the RF shield of the computer chassis 7 to the I/O expansion box 1 without the use of external RF filtering. The metal to metal contact established by attaching the bottom 5 to the rear panel 4 of the chassis 7 by the use of spring clips 20 provides the path for the extension of the RF shield from the chassis 7 to the I/O expansion box 1. The RF shield for the expansion box 1 is further extended from the bottom 5 to the cover 3 by the metal to metal contact established by the tabs 22 of the bottom 5 making contact with the side walls 28 of the cover 3 when the cover 3 and the bottom 5 are brought together to form the I/O expansion box 1. Consequently, the I/O expansion box 1 provides RF shielding without the use of any external RF filtering techniques.

Figure 4:
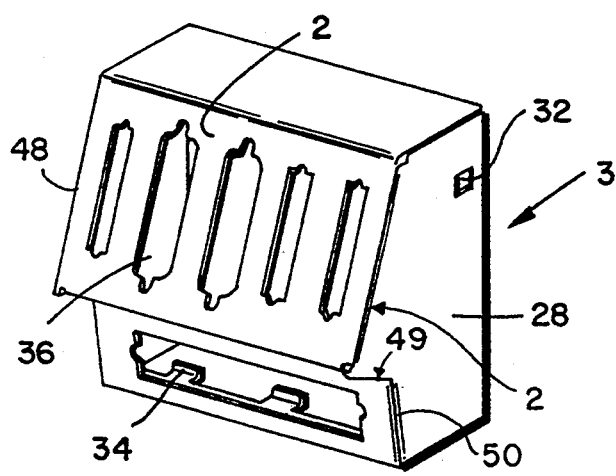
FIG. 4 is a perspective view of another embodiment of a cover of an I/O expansion box according to the principles of the invention.
Figure 5:
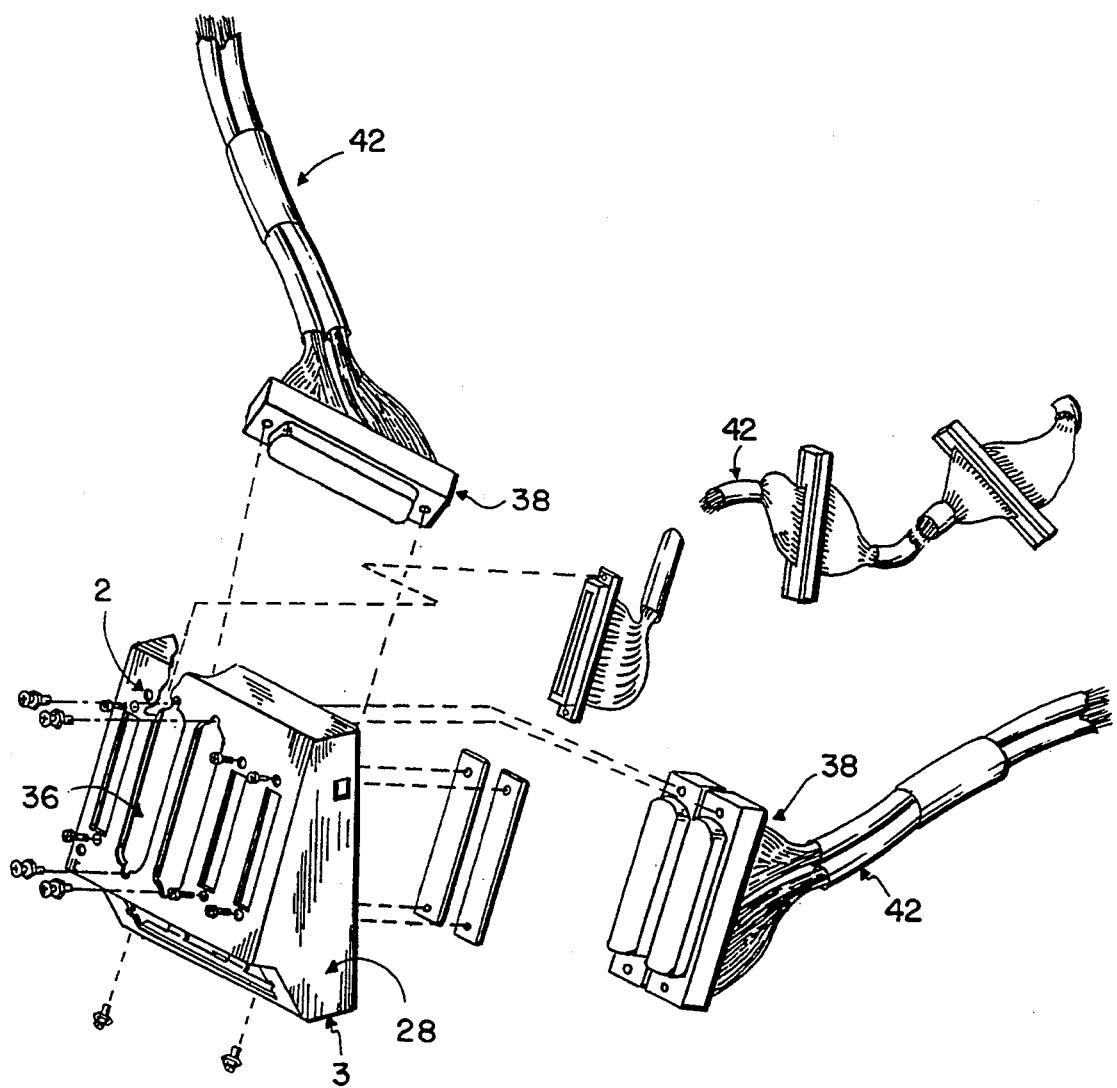
FIG. 5 is an exploded perspective view of the cover of FIG. 3 showing how connectors and cables are mounted.
Figure 6:
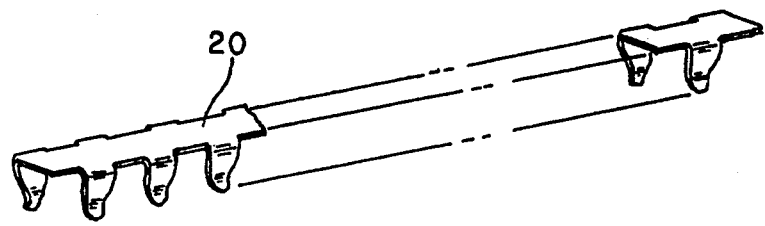
FIG. 6 is a perspective view of a "U" clip used to attach an I/O expansion box to a computer system chassis.

The cover 3 can be designed differently to provide additional number of connector openings 36 for additional I/O ports as required for system upgrades. In an alternate embodiment, as shown in FIG. 4, the cover 3 includes six connector openings 36 to act as six I/O ports, thereby providing four additional I/O ports. As shown, the top 2 of the cover 3 has slanting surfaces 48, 49 and 50, each surface being slanted with respect to the rear panel 4 of the computer system chassis 7. By providing a slanting top 2 the recess 30 is made larger thereby allowing more space within the I/O expansion box 1 for more I/O cables 42 and more connectors 38 to be connected to the cover 3. Further, connectors 38 attach to openings 36 on the top 3 at an angle effective to preventing the cables from crimping by accommodating the bend radius of the electrical cables that are attached to the connectors 38. The slant angle will vary to accommodate different bending radii. Good results have been obtained by setting the angle formed between the slanted surface 48 and the rear panel 4 of the computer system chassis to be 19 degrees, and the angle between the slanted surface 50 and the rear panel 4 of the computer system chassis to be 31 degrees, when using cable 42 having a bend radius of 3 inches. As shown, the cover 3 may be attached to the bottom 5 of FIG. 2 thereby forming an I/O expansion box 1 that provides six I/O ports.

The apparatus that is described above was used to provide added functionality to a computer system chassis by allowing for expansion of the number of I/O ports available to the chassis. It will be apparent to those skilled in the art that various modifications and variations can be made in the apparatus and method of the present invention to provide several additional I/O ports. Thus, it is intended that the specification and drawings be considered as exemplary only, with the true scope and spirit of the invention being indicated by the following claims.

We claim:

1. An I/O expansion box for increasing the number of electrical I/O ports to an existing computer chassis comprising:

a bottom including a base plate having side walls that extend laterally away from the base plate to form a recess, the base plate having openings for cables from the computer chassis to pass therethrough, the base plate further having lips at the opening to attach the bottom at an I/O port on the chassis, the lips extending outwardly of the base plate away from the recess and shaped for clipped attachment to the I/O port on the chassis, one of said side walls having slots therein, a multiplicity of said side walls having tabs thereon, some of said multiplicity of side walls having tabs further having clips thereon;

a cover sized to fit on the bottom and including a top having side walls that extend laterally away from the top to form a recess, the top having openings therein for placement of electrical cable connectors, the number of openings in the top being greater than the number of openings in the base plate, one of said side walls of the cover having pivot points at an edge thereon for mating with the slots of the one of said side walls of the base plate, another of said side walls of the cover having openings for mating with the clips of the another side wall of the base plate to hold the bottom and the cover together when they are brought together to close the I/O expansion box.

2. The apparatus of claim 1 wherein the number of openings in the base plate of the bottom is one.

3. The apparatus of claim 1 wherein the number of openings in the top of the cover is four.

4. The apparatus of claim 1 wherein the top of the cover is in a slanted relationship with respect to the exterior panel of the computer system chassis thereby accommodating a bend radius of the electrical cable connected to the opening thereon.

5. The apparatus of claim 1 wherein the lips at the opening of the base plate are L-shaped.

6. A mounting arrangement for mounting an I/O expansion box to a computer system chassis comprising:

a computer system chassis having a rear panel, the rear panel having I/O port openings;

an I/O expansion box having a bottom, the bottom including a base plate having side walls that extend laterally away from the base plate to form a recess, the base plate having openings for cables from the computer chassis to pass therethrough, the base plate further having lips at the opening, the lips extending outwardly of the base plate away from the recess and shaped for clipped attachment to the I/O port openings on the chassis;

a clip, wherein the clip attaches the I/O expansion box to the computer system chassis by clipping together the lips of the base plate of the I/O expansion box to edges of the I/O port openings of the computer system chassis while also extending an RF shielding effect of the computer system chassis to the I/O expansion box.

7. The apparatus of claim 6 wherein the clip is a "U" shaped in transverse cross-section and has serrated sides.

8. The apparatus of claim 6 wherein the clip is coated with an epoxy material thereby acting as an anti-chaffing device for the cables from the computer chassis that pass through the opening on the base plate of the bottom and the opening on the rear panel of the computer system chassis by covering edges of the lips at the opening of the base plate and the opening on the exterior panel of the computer system, preventing the cables from chaffing by rubbing against the edges.

9. An I/O expansion box for increasing the number of electrical I/O ports to an existing computer chassis comprising:

a bottom including a base plate having side walls that extend laterally away from the base plate to form a recess, the base plate having openings for cables from the computer chassis to pass therethrough, the base plate further having lips at the opening to attach the bottom at an I/O port on the chassis, the lips extending outwardly of the base plate away from the recess and shaped for clipped attachment to the I/O port on the chassis, one of said side walls having slots therein, a multiplicity of said side walls having tabs thereon, some of said multiplicity of side walls having tabs further having clips thereon;

a cover sized to fit on the bottom and including a top having side walls that extend laterally away from the top to form a recess, the top having slanting surfaces and having openings therein for placement of electrical cable connectors, the number of openings in the top being greater than the number of openings in the base plate, one of said side walls of the cover having pivot points at an edge thereon for mating with the slots of the one of said side walls of the base plate, another of said side walls of the cover having openings for mating with the clips of the another side wall of the base plate to hold the bottom and the cover together when they are brought together to close the I/O expansion box.

10. The apparatus of claim 9 wherein the surfaces of the top are sufficiently slanted to accommodate the bending radius of electrical cables attached to the electrical connectors wherein the cables are not crimped.

11. The apparatus of claim 9 wherein the number of openings in the top of the cover is six.

* * * * *